United States Patent
Münch et al.

(10) Patent No.: US 6,883,883 B2
(45) Date of Patent: Apr. 26, 2005

(54) HOUSING WITH PANELING ELEMENTS

(75) Inventors: Udo Münch, Sinn (DE); Paul Root, Bad Endbach (DE); Heinz Schmitt, Dietzhölztal (DE); Matthias Müller, Dillenburg (DE); Markus Neuhof, Ehringshausen-Niederlemp (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/411,893

(22) Filed: Apr. 11, 2003

(65) Prior Publication Data

US 2003/0214777 A1 Nov. 20, 2003

(30) Foreign Application Priority Data

Apr. 12, 2002 (DE) .......................................... 102 16 452

(51) Int. Cl.⁷ ............................................... A47B 88/00
(52) U.S. Cl. ....................... 312/326; 312/329; 312/324; 312/326; 312/223.1
(58) Field of Search .............................. 312/293.3, 294, 312/326, 329, 223.1, 223.2, 324; 16/254, 270; 403/3; 248/284.1, 291.1

(56) References Cited

U.S. PATENT DOCUMENTS

| | | | | |
|---|---|---|---|---|
| 2,589,370 A | * | 3/1952 | Grennan | 312/200 |
| 3,225,381 A | * | 12/1965 | Fountain | 16/244 |
| 3,662,493 A | * | 5/1972 | Foltz | 49/388 |
| 3,794,395 A | * | 2/1974 | Damico et al. | 312/209 |
| 4,480,809 A | * | 11/1984 | Healey | 248/185.1 |
| 4,979,785 A | * | 12/1990 | Richards | 312/201 |
| 5,187,837 A | * | 2/1993 | Gunderson et al. | 16/375 |
| 5,265,954 A | * | 11/1993 | Keil | 312/405 |
| 5,666,764 A | * | 9/1997 | Beatty et al. | 49/397 |
| 5,787,724 A | * | 8/1998 | Pohl et al. | 62/389 |
| 5,975,663 A | * | 11/1999 | Becker | 312/405 |
| 5,992,028 A | * | 11/1999 | Wing | 33/194 |
| 6,457,278 B1 | * | 10/2002 | Fleming | 52/37 |
| 6,634,727 B1 | * | 10/2003 | Torres | 312/321.5 |

OTHER PUBLICATIONS

WO 89/00823, Paine, Alan et al., Feb. 9, 1989.*

* cited by examiner

Primary Examiner—Peter M. Cuomo
Assistant Examiner—Sarah C. Burnham
(74) Attorney, Agent, or Firm—Pauley Petersen & Erickson

(57) ABSTRACT

A housing with paneling elements, at least one of which is embodied as a door panel and can be fixed on the housing in a closed position and an opened position. If threaded receivers, which are oriented toward each other, are positioned on two oppositely located panel elements at least in the connecting area with a vertically adjoining panel element, and fastening elbows are connectible with the bearing receivers in adjustable angular positions by clamping screws having an adjustment knob and can be fixed in place, then the housing can be easily attached to a fastening surface and its angular position can be adjusted.

18 Claims, 2 Drawing Sheets

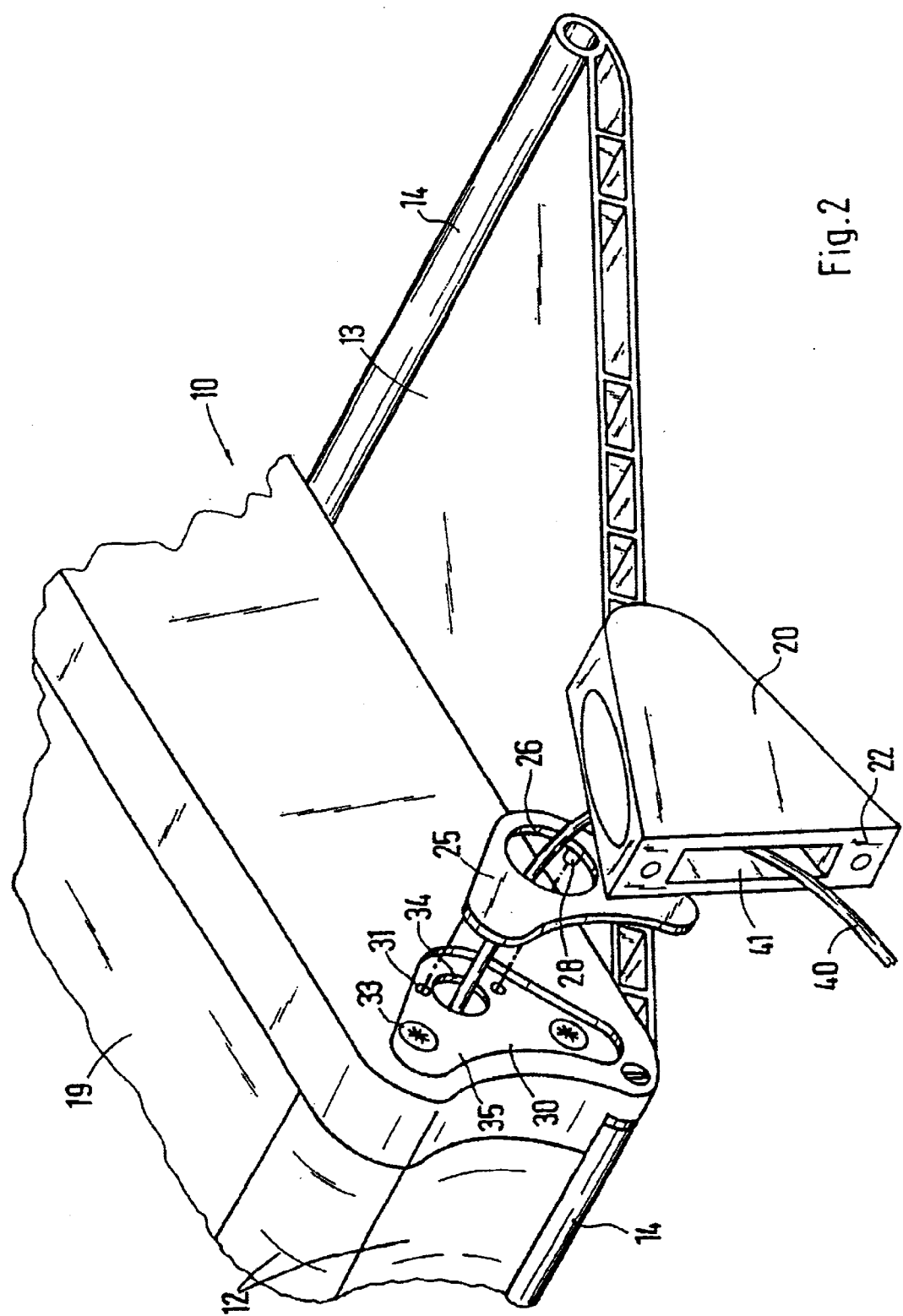

HOUSING WITH PANELING ELEMENTS

BACKGROUND OF THE INVENTION

1. Field of the Invention

This invention relates to a housing with paneling elements, at least one of which is embodied as a door panel and can be fixed on the housing in the closed and opened position.

2. Discussion of Related Art

Often, housings are embodied as flat housings and are used as control housings, wherein the bearing axis of the door panel formed by bearing receivers and bearing bolts can be vertically or horizontally oriented. The door panel allows access to the interior of the housing on one side of the housing.

If such a housing is used as the control housing of a machine control or the like, it must be possible to simply fasten the housing on a wall or the machine itself.

SUMMARY OF THE INVENTION

It is one object of this invention to provide a housing of the type mentioned above but with a simple fastening device, which does not interfere with access to the housing interior via the door panel, and which includes an adjustment possibility for the housing.

In accordance with this invention, this object is achieved with threaded receivers, oriented toward each other, on two oppositely located panel elements at least in the connecting area with a vertically adjoining panel element, and fastening elbows that can be connected with the bearing receivers in adjustable angular positions by clamping screws having an adjustment knob and can be fixed in place.

A hinged attachment device for the entire housing is created by simple fastening elbows, the threaded receivers and the clamping screws with the adjustment knob, wherein the housing can be pivoted around the pivot axis thus created and fixed in place in the set angular position. In this case the pivot axis can be horizontally or vertically oriented, and the housing can be pivotably attached to an appropriately oriented fastening surface. The fastening surface can be a part of the machine, if this relates to a control housing of a machine control.

If the two oppositely located panel elements have recesses or openings in both connecting areas with the vertically adjoining paneling elements, into which connecting panels can be screwed or snapped, the connecting panels support the threaded receivers and are closed off with cover panels, and the cover panels receive slide ring disks through which the clamping screws are passed, then the hinged attachment device can be provided on the left or the right, or the bottom or top of the housing. Thus only the orientation of the pivot axis and the occupation of one or the other pair of recesses or openings in the two oppositely located paneling elements is of particular importance.

In a further embodiment, the connecting panel and the cover panel close the opening or the recess of a paneling element flush. The fastening elbow can be definitely clamped to the housing and fixed in place in its angular position.

In a further embodiment, the cover panel and the slide ring disk form a plastic bearing, the angular position of the housing in relation to the fastening surface can still be adjusted in the fixed position, provided sufficiently strong adjustment forces are applied.

The definite clamping is assured because the adjustment knob of the clamping screw transitions into the clamping screw by a clamping section, and the clamping screw is passed through a bore of the fastening elbow and the bore of the slide ring disk and screwed into the threaded receiver of the connecting panel. To increase friction it is possible to employ a friction disk.

The cover panel can be pre-fixed in place on the housing using plug projections in plug receivers of the connecting panel.

In one embodiment, the connecting panel can be used to assemble the housing so that the connecting panels inserted or snapped into the recess or openings of the paneling elements are connected, in particular screwed together, with the vertically adjoining paneling elements.

The fastening elbows have a substantially triangle-shaped leg. The bore for the clamping screw is located in the area of the rounded tip, and the base of the legs is bent off as a fastening flange.

In one embodiment, the fastening of the fastening elbows on the housing is such that the fastening flanges of the two fastening elbows are oriented toward each other.

If the slide ring disks are of a thickness which is slightly greater than the thickness of the covering panels, then the plastic bearing determines the displacement forces for changing the angular position of the housing.

The electrical connection of the housing is simplified because at least one fastening elbow is embodied as a hollow element and cable entry, and each cable is introduced into the housing in the area of the pivot axis through bores in the covering panel and the connecting panel, without interfering with the hinged attachment device and the attachment of the door panel.

BRIEF DESCRIPTION OF THE DRAWINGS

This invention is explained in view of an exemplary embodiment represented in the drawings, wherein:

FIG. 2 is a perspective partial view, wherein a fastening elbow is embodied as a hollow body and cable entry, and the cable is introduced in the area of the pivot axis.

DESCRIPTION OF PREFERRED EMBODIMENTS

Figure 1:
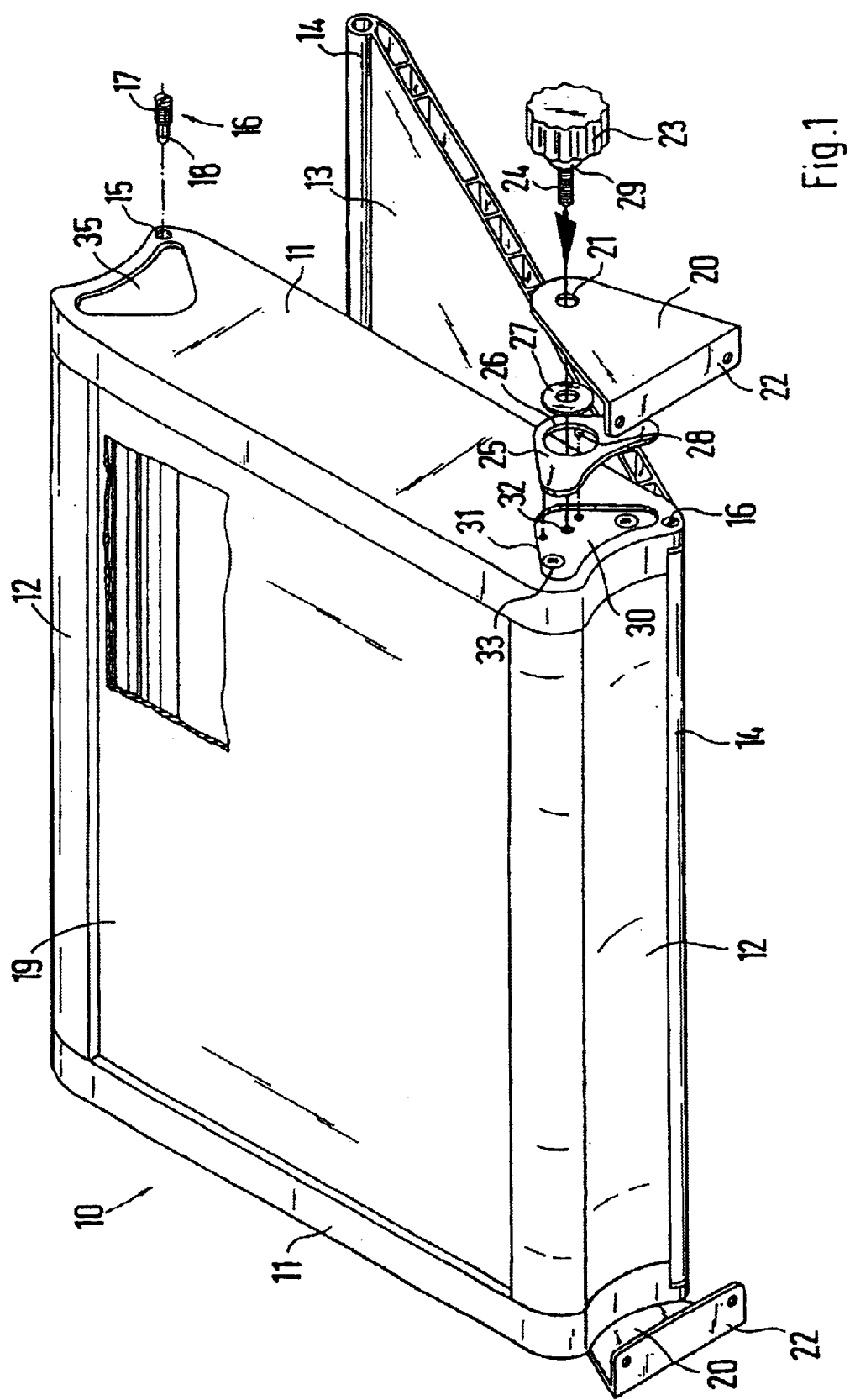
FIG. 1 is a perspective front view of a housing designed as a flat housing, with a door panel hinged on it and opened and with the parts required for a hinged attachment device.

The housing 10 represented in FIG. 1, is constructed from two identical paneling elements 11, two identical paneling elements 12, a door panel 13 and a front plate 19. In this case the front plate 19 can be maintained in a circumferential groove of the paneling elements 11, 12, which are connected to form a frame. In the housing 10 used as a control housing, the front plate 19 can support the control and/or the display elements. The side of the housing 10 located opposite the front plate 19 can be closed off by a door panel 13, which is embodied to be double-walled in one embodiment and is cut to size as a section of a profiled support. Separating walls form longitudinal chambers in the door panel 13, and the sides of the door panel 13 facing the paneling elements 12 are embodied as continuous bearing receivers 14. In the closed position, the paneling elements 11 cover the open front sides of the door panel 13 and support threaded receivers 15 near or in the area of the bearing receivers 14. Bearing bolts 18 provide the fixation of the door panel 13 in place on the paneling elements 11. In this case the threaded elements 17 of the bearing bolts 16 are screwed into the threaded receivers 15 of the paneling elements 11 so that their bolt ends 18 are introduced into the bearing receivers 14.

It is thus possible to hinge the door panel 13 on the housing 10 using two bearing bolts 16, in the one or the other fastening position, such as on the left or the right or on the bottom or the top, depending on the orientation of the paneling elements 12 in a horizontal or vertical direction. The door panel 13 can be fixed in the closed position by four bearing bolts 16.

The paneling elements 11 can have recesses or openings 35 in the two end areas, such as connecting areas with the paneling elements 12, into which connecting panels 30 can be seated or snapped. The connecting panels 30 can also be screwed together with the paneling elements 12, as indicated by the screws 33. In this case the screws 33 can be screwed into screw channels of the paneling elements 12, which are embodied as a section of a profiled train.

The connecting panels 30 can have a threaded receiver 32, which defines a pivot axis in the area of a paneling element 23 which can be oriented horizontally or vertically. With two fastening elbows 20, the housing 10 can be fastened on a fastening surface so that its angular position can be adjusted. For this purpose a covering panel 25 is plugged onto the connecting panel 30, as indicated by the plug elements 28 and the plug receivers 31. The covering panel 25 closes off the recess or the opening 35 flush, so that the slide ring disk 27 inserted into the covering panel 25 can form a plastic bearing, which defines the displacement forces when the angular position of the housing is changed.

The clamping screw 24 has a clamping section 29 and an adjustment knob 23, so that it can be screwed into the threaded receiver 32 of the connecting panel 30 after having been passed through the bore 21 of the fastening elbow 20 and the bore of the slide ring disk 27. During this, the leg of the fastening elbow 20 with the bore 21 is clamped on the housing 10, such as on the paneling elements 11, in the set angular position, and the angular position is fixed. The fastening elbows 20 are fastened, facing each other, on the housing 10 by the fastening flanges 22.

As shown in the drawings, the hinged attachment device can be placed into the area of one or the other connecting element 11, because recesses or openings 35 for connecting panels 30 and covering panels 25 are in both end areas, and fastening elbows 20 can be there attached. The threaded receivers 32 of the inserted connecting panels 30 define a continuous pivot axis.

The door panel 13 and the paneling elements 12 can be embodied as sections of extruded profiles. The lengths are identical, so that the width or height of the housing 10 can be set.

The fastening flanges 22 of the fastening elbows 20 can be connected with a vertical or a horizontal fastening surface. In that case the housing 10 can be horizontally or vertically adjusted around the pivot axis. Then the clamping screw 24 can also partially occupy the clamping position.

The plastic bearing between the covering panel 25 and the slide ring disk 27 permits a change in the orientation with an increase in the adjusting force. The friction can be increased near or in the area of the pivot bearing by an additional friction disk.

In FIG. 2, the housing 10 and the door panel 13 are represented enlarged only in the area of a fastening elbow 20. In this case the fastening elbow 20 is embodied as a hollow body and cable entry. The cable 40 is introduced through an opening 41 in the fastening flange 22 and is passed out again on the side facing the covering panel 25, and then passes through the bore 26 of the covering plate 25 and enters into the housing 10 through a bore 34 in the connecting panel 30.

German Patent Reference 102 16 452.5-34, the priority document corresponding to this invention, and its teachings are incorporated, by reference, into this specification.

What is claimed is:

1. In a housing having paneling elements, at least one of the paneling elements embodied as a door panel and fixable on the housing in one of a closed position and an opened position, the improvement comprising:
   a plurality of threaded receivers (32) oriented toward each other and provided on two oppositely located panel elements (11) at least in two connecting areas with two vertically adjoining panel elements (12); and
   a plurality of fastening elbows (20) connectible with the threaded receivers (32) in adjustable angular positions with clamping screws (24) having an adjustment knob (23) and fixable in position, the two oppositely located panel elements (11) having one of recesses and openings (35) in both connecting areas with the vertically adjoining paneling elements (12), into which connecting panels (30) are one of screwed and snapped, the connecting panels (30) supporting the threaded receivers (32) and closed off with cover panels (25), and the cover panels (25) receiving slide ring disks (27) through which the clamping screws (24) are passed.

2. In the housing in accordance with claim 1, wherein the two oppositely located panel elements (11) are oriented one of horizontally and vertically.

3. In the housing in accordance with claim 2, wherein one of the connecting panels (30) and the cover panels (25) close flush with one of the recesses and the openings (35) of the panel elements (11).

4. In the housing in accordance with claim 3, wherein the cover panels (25) and the slide ring disks (27) form a plastic bearing.

5. In the housing in accordance with claim 4, wherein the adjustment knob (23) of each of the clamping screws (24) transitions into the clamping screw (24) by a clamping section (29), and the clamping screw (24) passes through a first bore (21) of the fastening elbow (20) and a second bore of the slide ring disk (27) and is screwed into one of the threaded receivers (32).

6. In the housing in accordance with claim 5, wherein the cover panels (25) is fixed in place by plug elements (28) in plug receivers (31) of the connecting panels (30).

7. In the housing in accordance with claim 6, wherein the connecting panels (30) are connected with the vertically adjoining panel elements (12).

8. In the housing in accordance with claim 7, wherein each of the fastening elbows (20) has a substantially triangular leg with a bore for the clamping screw (24) near a rounded tip, and a fastening flange (22) is bent off on a base of the triangular leg.

9. In the housing in accordance with claim 8, wherein the fastening flanges (22) of the two fastening elbows (20) are oriented toward each other.

10. In the housing in accordance with claim 9, wherein each of the slide ring disks (27) is of a first thickness which is slightly greater than a second thickness of each of the covering panels (25).

11. In the housing in accordance with claim 10, wherein at least one of the fastening elbows (20) is embodied as a hollow element and cable entry, and at least one cable (40) is introduced into the housing (10) near a pivot axis through bores (26, 34) in one of the covering panels (25) and the connecting panels (30).

12. In the housing in accordance with claim 1, wherein the cover panels (25) and the slide ring disks (27) form a plastic bearing.

13. In the housing in accordance with claim 1, wherein the adjustment knob (23) of each of the clamping screws (24) transitions into the clamping screw (24) by a clamping section (29), and the clamping screw (24) passes through a first bore (21) of one of the fastening elbows (20) and a second bore of one of the slide ring disks (27) and is screwed into one of the threaded receivers (32) of the connecting panels (30).

14. In the housing in accordance with claim 1, wherein each of the cover panels (25) is fixed in place by plug elements (28) in plug receivers (31) of the connecting panels (30).

15. In the housing in accordance with claim 1, wherein the connecting panels (30) are connected with the vertically adjoining panel elements (12).

16. In the housing in accordance with claim 1, wherein each of the fastening elbows (20) has a substantially triangular leg with a bore for the clamping screw (24) near a rounded tip, and a fastening flange (22) is bent off on a base of the triangular leg.

17. In the housing in accordance with claim 1, wherein each of the slide ring disks (27) is of a first thickness which is slightly greater than a second thickness of each of the covering panels (25).

18. In the housing in accordance with claim 1, wherein at least one of the fastening elbows (20) is embodied as a hollow element and cable entry, and at least one cable (40) is introduced into the housing (10) near a pivot axis through bores (26, 34) in one of the covering panels (25) and the connecting panels (30).

* * * * *